United States Patent
James et al.

(10) Patent No.: US 10,320,949 B2
(45) Date of Patent: *Jun. 11, 2019

(54) REFERENCING CHANGE(S) IN DATA UTILIZING A NETWORK RESOURCE LOCATOR

(71) Applicant: MICROSOFT TECHNOLOGY LICENSING, LLC, Redmond, WA (US)

(72) Inventors: Alex James, Sammamish, WA (US); Michael Pizzo, Bellevue, WA (US); Pablo Castro, Redmond, WA (US); Mike Flasko, Duvall, WA (US); Lance Olson, Sammamish, WA (US); Jason Clark, Woodinville, WA (US); Sid Jayadevan, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 251 days.

This patent is subject to a terminal disclaimer.

(21) Appl. No.: 15/373,905

(22) Filed: Dec. 9, 2016

(65) Prior Publication Data
US 2017/0094032 A1 Mar. 30, 2017

Related U.S. Application Data

(63) Continuation of application No. 14/941,217, filed on Nov. 13, 2015, now Pat. No. 9,537,977, which is a
(Continued)

(51) Int. Cl.
*H04L 29/06* (2006.01)
*G06F 16/00* (2019.01)
(Continued)

(52) U.S. Cl.
CPC .............. *H04L 67/42* (2013.01); *G06F 16/00* (2019.01); *G06F 16/1734* (2019.01);
(Continued)

(58) Field of Classification Search
CPC ......... G06F 17/30194; G06F 17/30233; G06F 17/30377; G06F 17/30575;
(Continued)

(56) References Cited

U.S. PATENT DOCUMENTS 5,710,719 A * 1/1998 Houle ...................... G06T 9/40
341/60
7,444,585 B2 10/2008 McKellar
(Continued)

OTHER PUBLICATIONS

Oster, "Tombstone Transformation Functions for Ensuring Consistency in Collaborative Editing Systems", International Conference on Collaborative Computing: Networking, Applications and Worksharing, Nov. 17-20, 2006.
(Continued)

*Primary Examiner* — Le H Luu
(74) *Attorney, Agent, or Firm* — Workman Nydegger

(57) ABSTRACT

The subject disclosure relates to techniques for referencing a change in data utilizing a network resource locator. An interface component can receive one or more requests that are associated with a data set from a client, and send, based on the one or more requests, a network resource locator and at least one portion of the data set to the client. Further, a data service component can compute a parameter that is associated with a change of the data set, and include the parameter in the network resource locator. In other embodiments, the data service component can receive a request utilizing the network resource locator, determine the change of the data set based on the parameter, and send the change of the data set to the client.

40 Claims, 13 Drawing Sheets

Related U.S. Application Data continuation of application No. 13/329,145, filed on Dec. 16, 2011, now Pat. No. 9,208,244.

(51) Int. Cl.

| | | |
|---|---|---|
| *G06F 16/28* | (2019.01) | |
| *G06F 16/951* | (2019.01) | |
| *G06F 16/958* | (2019.01) | |
| *G06F 16/17* | (2019.01) | |
| *G06F 16/23* | (2019.01) | |
| *G06F 16/955* | (2019.01) | |
| *G06F 17/27* | (2006.01) | |
| *H04L 29/08* | (2006.01) | |

(52) U.S. Cl.
CPC ...... *G06F 16/2322* (2019.01); *G06F 16/2358* (2019.01); *G06F 16/282* (2019.01); *G06F 16/951* (2019.01); *G06F 16/958* (2019.01); *G06F 16/9566* (2019.01); *G06F 17/277* (2013.01); *H04L 67/02* (2013.01)

(58) Field of Classification Search
CPC ........... G06F 17/30887; G06F 17/3089; G06F 17/30; G06F 17/30144; G06F 17/30368; G06F 9/5016; G06F 17/277; G06F 16/958; G06F 16/9566; G06F 16/951; G06F 16/282; G06F 16/2358; G06F 16/2322; G06F 16/1734; G06F 16/00; G06T 9/40; H04L 51/063; H04L 67/26; H04L 67/42; H04L 67/02
See application file for complete search history.

(56) References Cited

U.S. PATENT DOCUMENTS

| | | | |
|---|---|---|---|
| 7,836,031 B2 | 11/2010 | Howard | |
| 9,208,244 B2 | 12/2015 | James et al. | |
| 2004/0205048 A1 | 10/2004 | Pizzo | |
| 2004/0210591 A1* | 10/2004 | Hirschfeld | G06F 17/30233 |
| 2006/0161913 A1* | 7/2006 | Barrs | G06F 9/5016 |
| | | | 717/170 |
| 2007/0005807 A1* | 1/2007 | Wong | H04L 51/063 |
| | | | 709/246 |
| 2007/0043824 A1* | 2/2007 | Fremantle | H04L 67/26 |
| | | | 709/214 |
| 2007/0112880 A1 | 5/2007 | Yang | |
| 2007/0226320 A1* | 9/2007 | Hager | G06F 17/30097 |
| | | | 709/219 |
| 2008/0162509 A1* | 7/2008 | Becker | G06F 17/30575 |
| 2008/0307010 A1* | 12/2008 | Cullison | G06F 17/30575 |
| 2009/0031004 A1 | 1/2009 | Yagoda | |
| 2016/0072926 A1 | 3/2016 | James et al. | |

OTHER PUBLICATIONS

Delta Links, Retrieved Jul. 1, 2011.
Determining the Synchronization Scope, Retrieved Jul. 1, 2011.
Office Action dated Jun. 10, 2016 issued in U.S. Appl. No. 14/941,217.
Notice of Allowance dated Sep. 1, 2016 issued in U.S. Appl. No. 14/941,217.
"Notice of Allowance Issued in U.S. Appl. No. 13/329,145", dated Aug. 6, 2015, 7 pages.
"Non Final Office Action Issued in U.S. Appl. No. 13/329,145", dated May 7, 2015, 5 pages.

\* cited by examiner

REFERENCING CHANGE(S) IN DATA UTILIZING A NETWORK RESOURCE LOCATOR

CROSS-REFERENCE TO RELATED APPLICATIONS

This application is a continuation of U.S. patent application Ser. No. 14/941,217 filed on Nov. 13, 2015, entitled "REFERENCING CHANGE(S) IN DATA UTILIZING A NETWORK RESOURCE LOCATOR," (now U.S. Pat. No. 9537977), which is a continuation of U.S. patent application Ser. No. 13/329,145 filed on Dec. 16, 2011, entitled "REFERENCING CHANGE(S) IN DATA UTILIZING A NETWORK RESOURCE LOCATOR," which issued as U.S. Pat. No. 9,208,244 on Dec. 8, 2015, and both applications are expressly incorporated herein by reference in their entirety.

TECHNICAL FIELD

The subject disclosure generally relates to referencing change(s) in data utilizing a network resource locator.

BACKGROUND

Representational state transfer (REST)-based data services can enable a client to perform operation(s), e.g., a request that is associated with a resource or a set of resources, e.g., a catalog of entries, etc. via a distributed hypermedia system, i.e., the World Wide Web (WWW). As such, the client can send multiple requests to a server, via hypertext transfer protocol (HTTP) messages, to enable the server to perform the operation(s).

The client may work with a local copy of data, i.e., obtained from the data service. In order to obtain changes that may have occurred to the resource or the set of resources, the client must download a new "snapshot" of the resource or set the of resources, i.e., in their entirety, and apply, e.g. merge or overwrite, the local data copy. Thus, REST-based data services do not enable the client to obtain information that is associated with changes to the resource or the set of resources in an efficient manner.

The above-described deficiencies of today's techniques are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

In accordance with one or more embodiments and corresponding disclosure, various non-limiting aspects are described in connection with referencing a change in data utilizing a network resource locator, e.g., enabling clients to obtain changes in respective data sets without downloading, copying, etc. such data sets in their entirety. Further, such non-limiting aspects do not require data service(s) associated with such data sets to monitor, store, etc. respective states of such clients.

For instance, an embodiment includes receiving, by a data service component of at least one computing device, e.g., a server, a first request, e.g., a query, an operation invocation (e.g., a function and/or a method), etc. that is associated with a data set from a client. Then, in response to receiving the first request, a token, or a change identifier, is computed for referencing a change of the data set. Further, portion(s) of the data set and a link including the token are communicated to the client.

In other embodiment(s), the computing the token includes (1) determining the token prior to computing a first portion of the portion(s) and/or communicating the first portion of the portion(s) to the client, (2) and/or determining a change identifier, e.g., a time, a timestamp, a date, etc. that is associated with the change, or a most recent detected change of the data set.

In another embodiment, the communicating the portion(s) of the data further includes: sending a first portion of the one or more portions and a first uniform resource locator (URL) including the token to the client. Then, in response to receiving a second request that is associated with a next portion of the one or more portions from the client, sending the next portion and a next URL including the token to the client.

Yet another embodiment can include receiving a second request including the link from the client; determining the change of the data set based on the link; and sending the change of the data set to the client. One embodiment can include ordering the sending the change of the data set based on a chronological order that respective changes in the data set occurred, e.g., by sending pages of results indicating the respective changes in chronological order, for example, in response to receiving the token in subsequent requests received from the client.

In another embodiment, the communicating the portion(s) of the data further includes: sending a first URL including the token to the client; receiving a second request including the first URL from the client; and sending a second URL including an other token to the client.

In yet another embodiment, the receiving the first request further includes receiving operator(s) for defining a result that is associated with the portion(s) of the data set. In an embodiment, the communicating further includes communicating the result and the link including the operator(s). In one embodiment, the receiving the first request further includes receiving operator(s) for formatting the result.

In one non-limiting implementation, an interface component can receive a request, e.g., a query, that is associated with a data set from a client, and send, based on the request, a network resource locator and portion(s) of the data set to the client. Further, a data service component can compute a parameter that is associated with a change of the data set, and include the parameter in the network resource locator.

In another non-limiting implementation, the request can utilize a network resource locator including the parameter. Further, the data service component can determine the change of the data set based on the parameter, and the portion(s) can include the change of the data set. In yet another non-limiting implementation, the request can include operator(s) for (1) defining a result that is associated with the portion(s) and/or (2) formatting the result.

In one embodiment, a method can include sending a first request that is associated with a data set to a data service. Further, in response to the sending the first request, receiving first information that is associated with the data set from the data service. Furthermore, in response to receiving a link, e.g., a URL, including a token for referencing a change of the data set from the data service, sending, utilizing the link, a second request to the data service. Moreover, the method can include receiving second information that is associated with the change of the data set from the data service based on the second request.

In another embodiment, the method can include populating a cache based on the first information, and updating the cache based on the second information.

In another embodiment, a method can include computing an initial data set and a token, e.g., an initial token, for referencing change(s), e.g., future change(s), to the initial data set; and providing portion(s) of the initial data set and a link including the token to a client. For example, the portion(s) of the initial data set and the link can be provided to the client via a bulk data transfer, via a physical media, encoded as part of an application, etc.

Further, the method can include receiving, e.g., by a data service component of at least one computing device, a request using the link from the client. Then, in response to receiving the request, communicating the change(s) to the initial data set to the client based on the token.

Other embodiments and various non-limiting examples, scenarios, and implementations are described in more detail below.

BRIEF DESCRIPTION OF THE DRAWINGS

Various non-limiting embodiments are further described with reference to the accompanying drawings in which.

DETAILED DESCRIPTION

Overview

Figure 1:
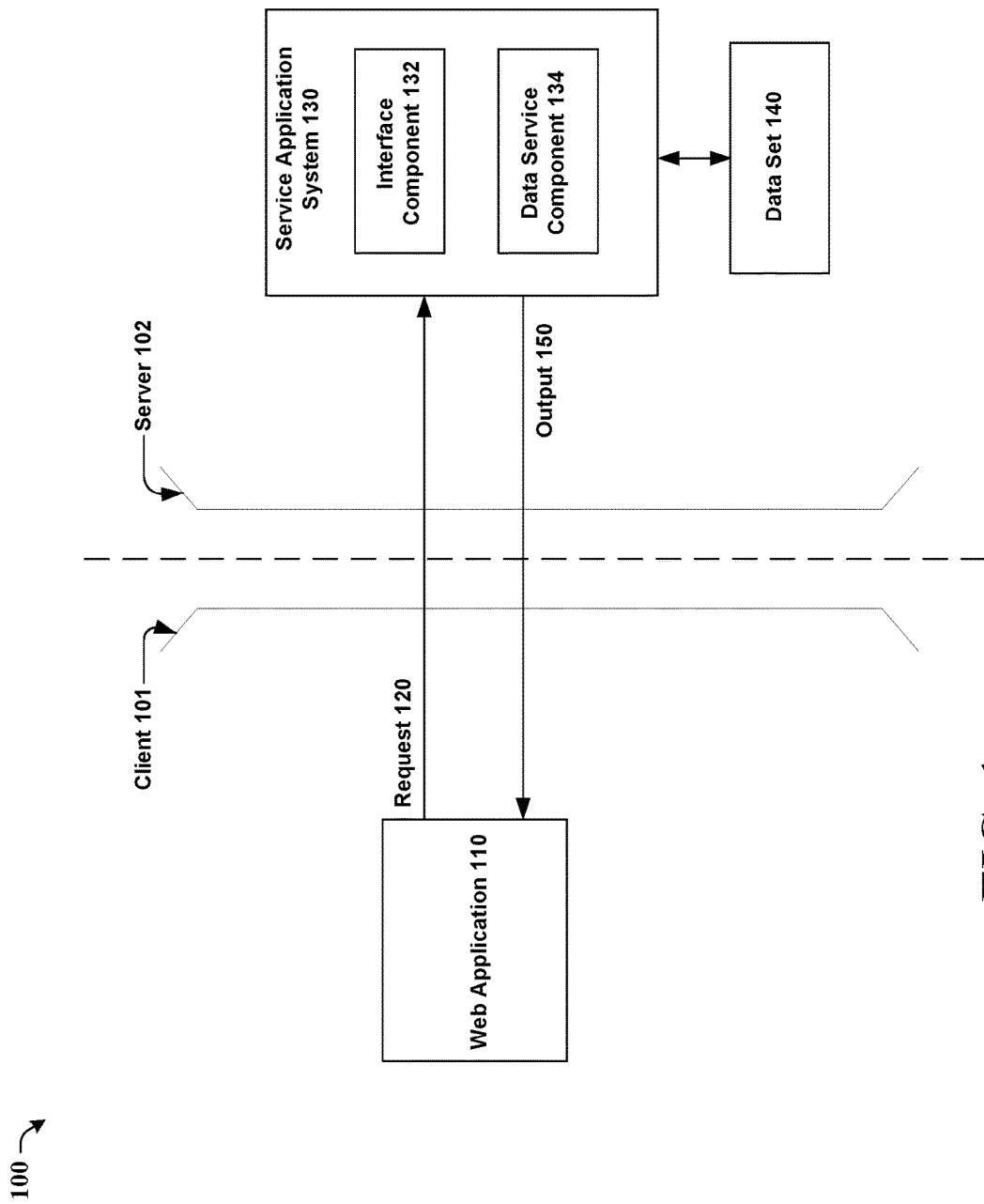
FIG. 1 illustrates an exemplary data services environment including a service application system for referencing a change in data utilizing a network resource locator according to an embodiment.

As indicated in the background, to obtain changes to a resource or a set of resources in a conventional REST-based data service technology, a client must request the resource or the set of resources, i.e., in their entirety as a full set of results, and compare the full set of results to a previously obtained reference version.

In consideration of these and other deficiencies of the conventional technologies, the subject matter disclosed herein relates to providing a mechanism for referencing a change in data utilizing a network resource locator, e.g., without requiring a data service to store per-client state information for referencing the change. As such, the subject matter disclosed herein enables a service to support a limitless number of clients, e.g., each client referencing respective changes to respective records, data sets, etc. of the client since the client last requested information of the respective changes.

In one embodiment, a method comprises receiving, by a data service component of at least one computing device, a first request, or a query, that is associated with a data set, or a subset of the dataset, from a client. Then, in response to the receiving the first request, computing a token for referencing a change of the data set, the subset of the dataset, etc. and communicating one or more portions of the data set, the subset of the dataset, etc. and a link including the token to the client. In an embodiment, the link can encode changes matching a criteria, or filter criteria, specified by the client. As such, subsequent portion(s) of the dataset, the subset of the dataset, etc. can be returned, or communicated, to the client based on the filter criteria.

In another embodiment, the method comprises receiving a second request including the link from the client; determining the change of the data set based on the link; and sending the change of the data set to the client.

In yet another embodiment, a system comprises an interface component stored in a computable readable storage medium configured to: receive one or more requests that are associated with a data set from a client, and send, based on the one or more requests, a network resource locator and at least one portion of the requested data set to the client. Further, a data service component can compute a parameter that is associated with a change of the data set, and include the parameter in the network resource locator.

In an embodiment, the one or more requests can include a request utilizing the network resource locator. Further, the data service component can determine the change of the data set based on the parameter. Furthermore, the at least one portion of the data set can include the change of the data set.

In one embodiment, a computer-readable storage medium is provided comprising computer executable instructions that, in response to execution, cause a computing device to perform operations. The operations include receiving first information that is associated with a data set from a data service in response to sending a first request that is associated with the data set to the data service. Then, in response to receiving a link including a token for referencing a change of the data set from the data service, sending, utilizing the link, a second request to the data service. Further, the operations include receiving second information that is associated with the change of the data set from the data service based on the second request.

In another embodiment, a method comprises computing an initial data set; computing a token for referencing change(s) to the initial data set; providing portion(s) of the initial data set and a link including the token to a client; receiving, by a data service component of at least one computing device, a request using the link from the client; and in response to the receiving the request, communicating the change(s) to the client based on the token.

Such techniques enable referencing a change in data utilizing a network resource locator associated with a platform, or application environment

Referencing a Change in Data Utilizing a Network Resource Locator

Referring now to FIG. 1, data services environment 100 is depicted including service application system 130 that is associated with server 102. In one embodiment, service application system 130, e.g., associated with a REST-based data service, includes interface component 132 and data service component 134. Interface component 132 can receive request 120 that is associated with data set 140 from client 101, e.g., via web application 110. In an aspect, data set 140 can include a data base, a catalog of data entries, a catalog of data elements, etc.

Further, interface component 132 can send, based on request 120, output 150 including a network resource locator and at least one portion of data set 140 to client 101. In one aspect, the network resource locator can include a uniform resource locator (URL). For example, request 120 can include a request for information that is associated with movies, e.g., movies available for rent, download, etc. via the Internet by-way-of a multimedia based data service that is, e.g., associated with service application system 130.

Furthermore, data service component 134 can compute a parameter, e.g., a token, a change identifier, a last change identifier, etc. that is associated with a change of data set 140, or a subset of data set 140, and include the token in the URL. In an aspect, data service component 134 can compute the token, the change identifier, the last change identifier, etc. indicating the change of data set 140 (or the subset), indicating a last, e.g., most recent, detected change of data set 140 (or the subset), etc. as a time, a timestamp, a date, etc. that is associated with the change of data set 140 (or the subset), before interface component 132 computes a first portion of data set 140 (or the subset), or communicates the first portion to client 101.

Referring to the example above, the timestamp can enumerate a time that a data base, for example, referencing movies for download, was last monitored, reviewed, etc. by data service component 134, e.g., for indicating movies available for rent, download, etc., via the multimedia based data service. In one aspect, data service component 134 can compute a token encoding an identification (ID) of a last change, e.g., the ID of an entry in a change log at a time a request was received by data service component 134. Furthermore, data service component 134 can enumerate changes of the data base by referencing more recent changes in response to receiving another request that is associated with the data base containing the ID of a last seen, or detected, change.

In another aspect, data service component 134 can compute the token, e.g., by determining a date, or date stamp, of the change; by determining the date based on a day and/or a time data set 140 was last updated via the multimedia based data service with respect to interface component 132 sending the first portion to client 101, etc.

As such, in response to receiving an other request that is associated with data set 140 utilizing the URL and including the token from client 101, data service component 134 can determine the change of data set 140 based on the token, e.g., for indicating a change in movies available for rent, download, etc., via the multimedia based data service. Further, interface component 132 can send the change of data set 140 to client 101.

In another aspect, the other request can include operator(s) for defining a result associated with the change of data set 140 and/or for formatting the result. For example, the other request can include an operator for filtering changes of data set 140 that are returned to client 101. As such, in an aspect, a filter operator included in the request, or the URL, can indicate that client 101 requests output 150 be limited to include only changes of data set 140 related to a particular characteristic, e.g., related to a movie, e.g., whether the movie is available for rent, download, etc. via the multimedia based data service, e.g., service application system 130. In one aspect, a formatting operator included in URL can indicate that client 101 requests output 150 be formatted in a particular way, e.g., display output 150 as a row/column matrix, etc.

Thus, unlike conventional techniques, server 102 can enable client 101 to obtain information that is associated with changes to data set 140 without downloading, copying, etc. data set 140, in its entirety and/or without monitoring, storing, etc. a state of client 101 by server 102.

Referencing a Change in Data Utilizing a Network Resource Locator Via Open Data Protocol Open Data Protocol (OData) enables the creation of REST-based data services, which allow resources using Uniform Resource Identifiers (URIs) and defined in an abstract data model, to be published and edited by WWW, or Web, clients using HTTP messages. OData is based on conventions defined in Atom Publishing Protocol (ATOM) and applies Web technologies such as HTTP and JavaScript Object Notation (JSON) to create a protocol that enables access to information from a variety of applications, services, and stores, e.g., relational databases, file systems, content management systems, Web sites, etc.

As such, OData includes feeds, which are collections of typed entries. Each typed entry represents a structured record with a key that has a list of properties. Further, entries can be part of a type hierarchy and can have related entries and related feeds via links. For example, the following URI represents a feed of product entries: http colon slash slash services dot odata dot org slash OData slash OData dot svc slash Products. Simple OData services can include a feed. More sophisticated OData services can have several feeds. Thus, a client can discover such feeds and addresses associated with such feeds by referencing a service document. For example, the following URI identifies a service document for a sample OData service: http colon slash slash services dot odata dot org slash OData slash OData dot svc. Further, OData services can expose service operations that are service-specific functions and methods that accept input parameters and return entries or complex/primitive values.

OData services expose feeds, entries, properties within entries, links, service documents, and metadata documents via URIs in one or more formats, which can be acted on by clients using basic HTTP requests. To enable clients to discover the shape of an OData service, the structure of resources of the OData service, links between the resources, and service operations associated with the resources, an OData service can expose a service metadata document. The service metadata document can describe the data model, or Entity Data Model (EDM), e.g., describing structure and organization of resources associated with the data model, exposed as HTTP endpoints by the OData service.

Figure 2:
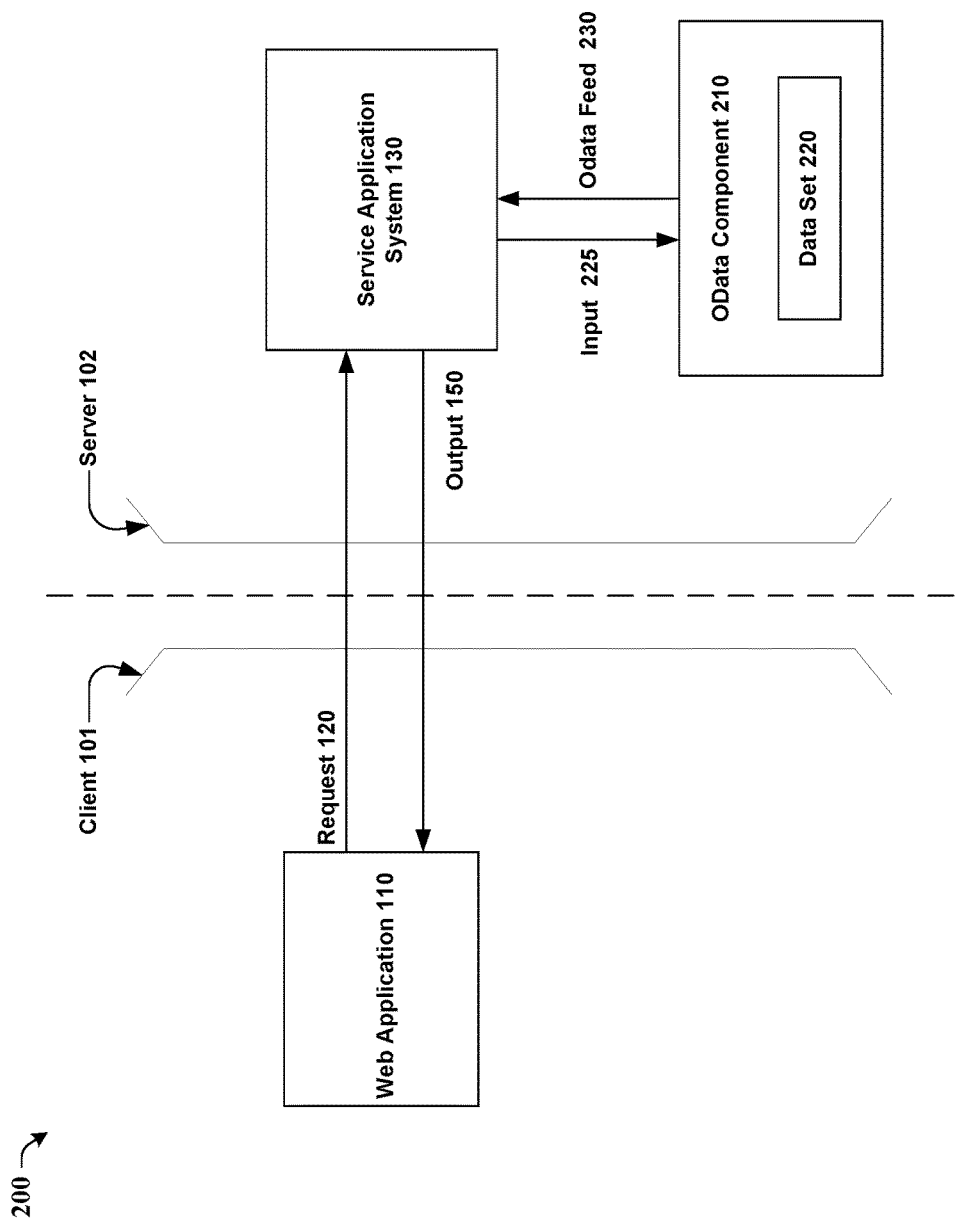
FIG. 2 illustrates another exemplary data services environment for referencing a change in data utilizing a network resource locator according to an embodiment.
Figure 3:
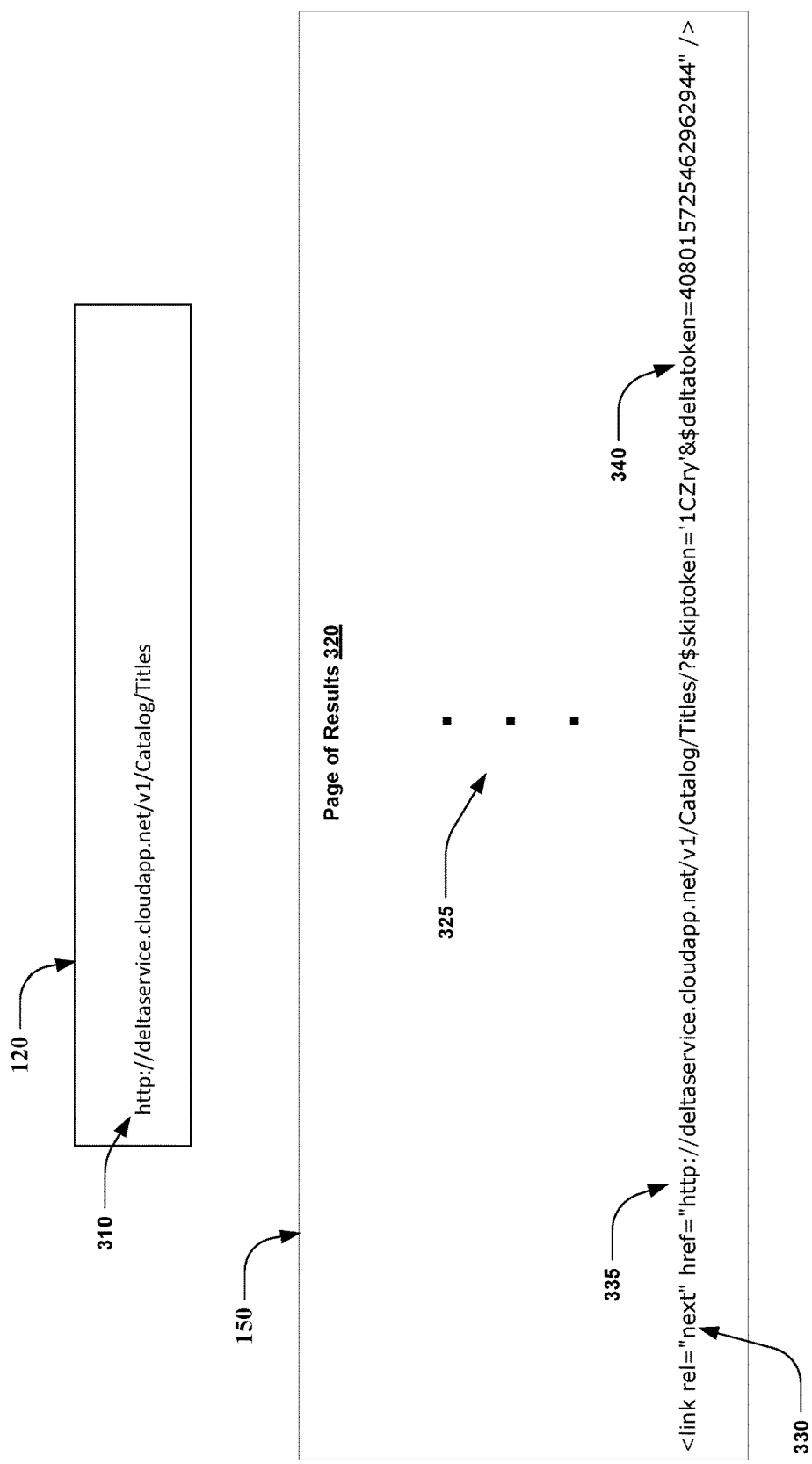
FIGS. 3-6 illustrate exemplary queries received and output sent via respective data service application systems according to various embodiments.

Now referring to FIG. 2, server 102 is depicted including OData component 210 for referencing a change in data utilizing a network resource locator, according to an embodiment. OData service component 210 can expose feeds, e.g., OData feed 230, data entities of data set 220, etc. based on input 225 that is associated with query 120 including the network resource locator.

For example, and now referring to FIGS. 3-6, OData component 210 can publish, return, etc. one or more changes in the data entities of data set 220, e.g., one or more changes to a typed entry associated with OData feed 230, based on request 120 including one or more exemplary queries, e.g., URL 310, URL 335, URL 435, URL 535, etc. received via service application system 130. For example, service application system 130 can receive, via request 120, URL 310 that is associated with an initial query requesting data entities, e.g., movie titles, included in data set 220, which are available for download via an Odata enabled Internet based multimedia service, e.g., movieservice dot com, deltaservice dot cloudapp dot net, etc.

Upon receiving URL 310 via input 225, OData component 210 can output a first page of results, e.g., page of results 320 including material 325 and next link 330 via output 150. Next link 330, which is located at the end of page of results 320, includes URL 335 that is associated with a second page of results (see page of results 420) and can encode delta token 340. In an aspect, delta token 340 encodes a time, a timestamp, a date, etc. of the last change of data set 220 before enumerating the first page of results. For example, delta token 340 encodes a timestamp representing a last recognized update of movies available for download via OData component 210.

Figure 4:
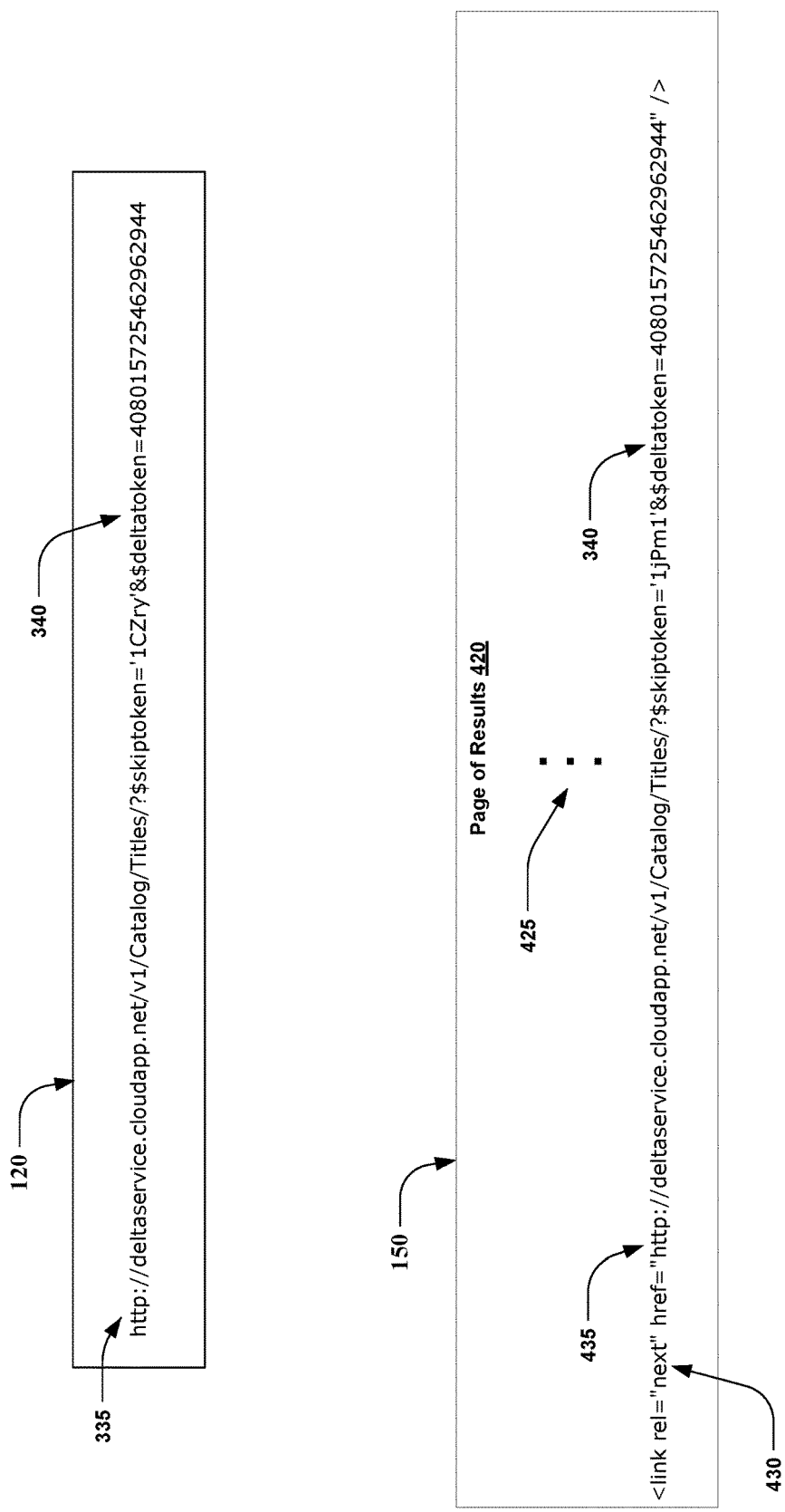
Figure 5:
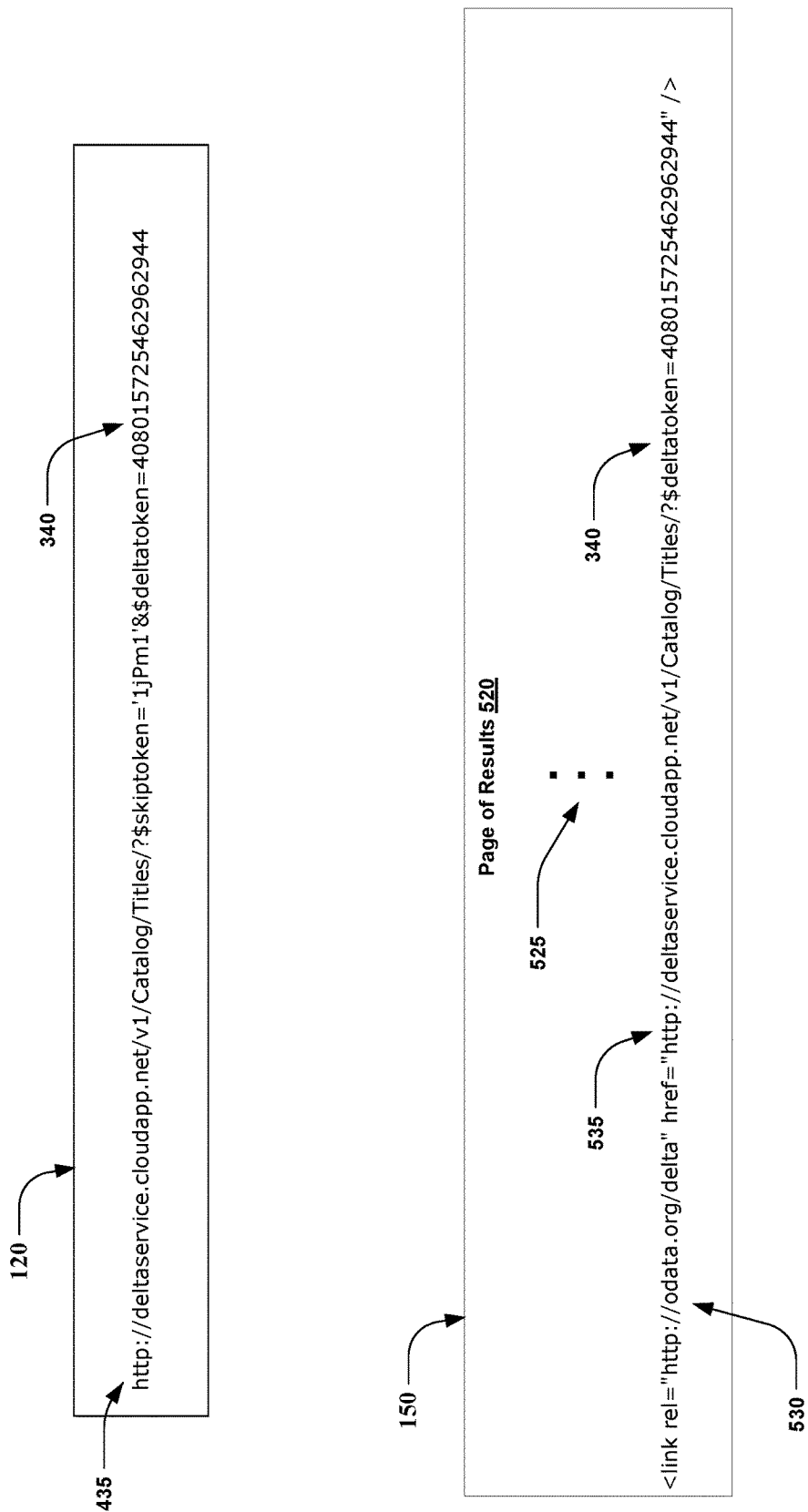
Figure 6:
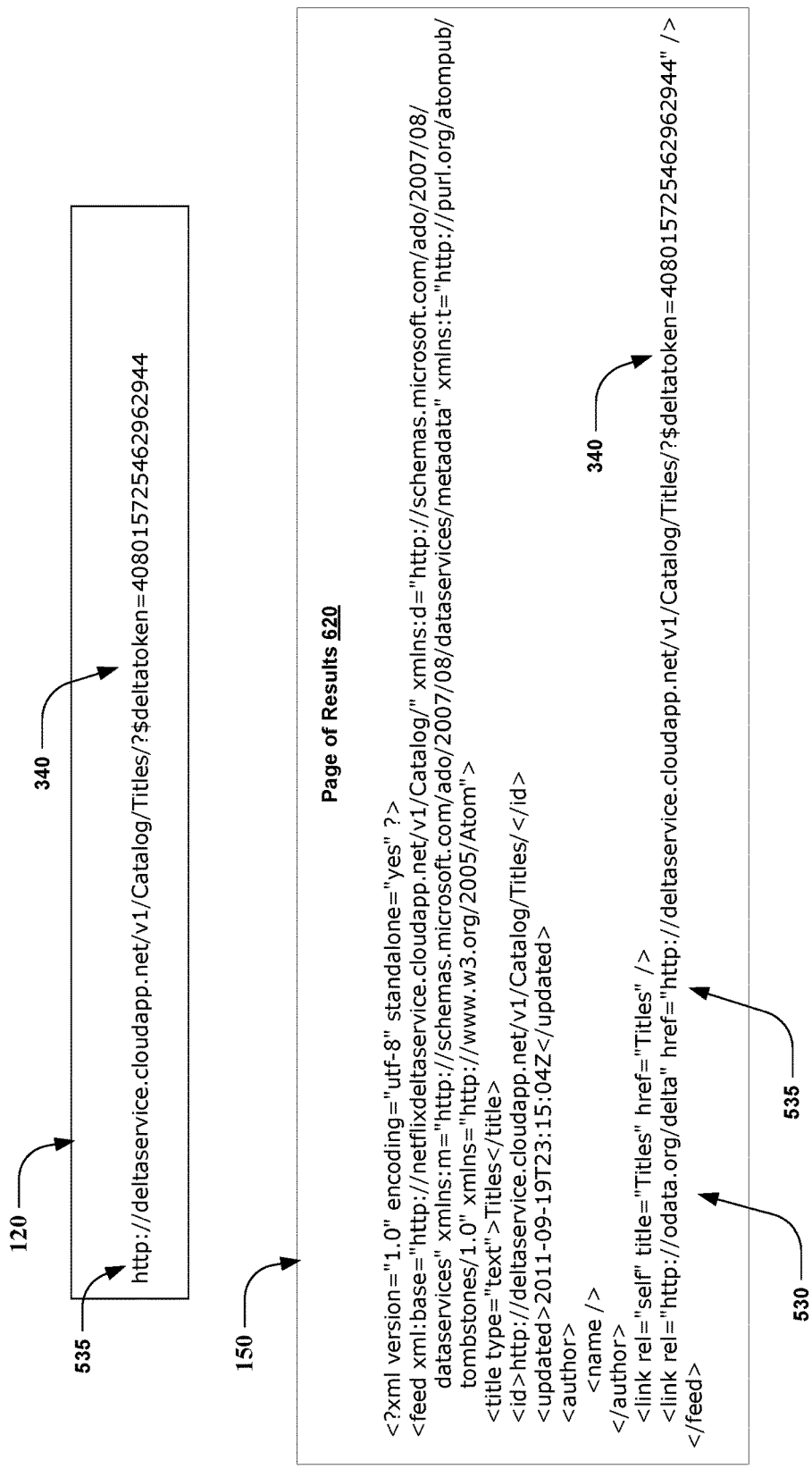

In embodiments illustrated by FIGS. 4-6, delta token 340 can be passed, or tunneled, from the first, or initial, page of results through a last, or final, page of results that is associated with the initial request. For example, in response to receiving, by service application system 130, another request, e.g., request 120 including URL 335, for obtaining the second page of results, OData component 210 can output the second page of results, e.g., page of results 420 including material 425 and next link 430 via output 150. Next link 430, which is located at the end of page of results 420, includes URL 435 that is associated with a third page of results (see page of results 520) and can encode delta token 340. As such, as illustrated by FIG. 5, in response to service application 130 receiving yet another request, e.g., request 120 including URL 435, for obtaining the third page of results, OData component 210 can output the third page of results, e.g., page of results 520 including material 525 and delta link 530 via output 150. In an aspect, OData component 210 can order results, e.g., 320, 420, 520, etc. in a chronological order that respective changes in data set 220 occurred.

Delta link 530, which is located at the end of page of results 520, includes URL 535 that can encode delta token 340. As such, delta link 530 (1) encodes delta token 340 carried, or tunneled, through the paged requests and (2) includes URL 535, which client 101 can utilize, via query 120, to obtain changes made to data set 220 since the first page of initial results was returned to client 101. In an aspect, such changes can reference and/or include deleted records, e.g., via tombstone(s), inserted records, or changed records. In another aspect, if pages of changes are available, a page of the pages includes a next link for referencing a next page of such changes.

In an aspect, delta link 530 can return a subset of the changed records based on (1) a filter criteria specified in an initial request that can be subsequently encoded in delta link 530, and/or (2) a filter criteria appended to delta link 530 for obtaining the subset of the changed records.

In one example, delta link 530 can encode a criteria, e.g., associated with movies available for instant view, based on the initial request being associated with the movies available for instant view. In another example, the filter criteria can be appended by the client to delta link 530, delta token 540, etc., for example, to further restrict results returned by OData component 210, e.g., to obtain the subset of the records indicating movies that have received a movie rating greater than four stars.

In another example, the filter criteria can be appended by the client to delta link 530, delta token 540, etc., for example, to other request results, or subset(s) of changed records, etc. to be returned by OData component 210 in groups, for example, of 10, e.g., ten movies per request.

In yet another aspect, in response to OData component 210 ordering results in a chronological order, next link 430 can be associated with, or indicate, a last detected change that is associated with page of results 420. As such, service application system 130 can receive request(s), utilizing next link 430, for obtaining, paging through, or referencing one or more changes that are associated with page of results 420.

For example, Table I below describes Atom format for referencing and/or including deleted record(s) via tombstone(s). An entry or resource of data set 220 that is deleted can be referenced, via server 102, by (1) an identification, or id; (2) a time that the resource was deleted; and/or (3) an OData specific attribute that specifies whether the deleted entry represents an entry that was deleted (or destroyed), or removed from membership in the result, the second information, etc., for example, due to a change to the referenced resource such that it is no longer a member of the set specified in the initial request:

TABLE I

```
deletedEntry = element at:deleted-entry {
    atomCommonAttributes,
    attribute ref { atomUri },
    attribute when { atomDateConstruct },
    attribute m:reason { 'deleted' | 'changed' }
}
```
In which m: is a prefix associated with the metadata namespace for OData: (for example, "http://odata.org/metadata")

In another example, a tombstone in JSON is returned as an object in a results array that includes a property named "_deleted" that is associated with (1) a URL for an element of data set 220 that was deleted/removed; (2) a date and/or a time associated with deletion or removal of the element; and (3) a string value indicating whether the element represents a resource of data set 220 that was removed from data set 220 because it was modified or deleted.

In yet another example, as illustrated by FIG. 6, in response to receiving by service application 130 request 120 including URL 535 associated with delta link 530, OData component 210 can output page of results 620 with no entries that includes delta link 530 and URL 535. As such, page of results 620 indicates that no changes in data set 220 have occurred since OData component 210 received the initial query.

For example, Table II below describes Atom format for enumerating the last page of results that is associated with the initial query:

TABLE II

```
<?xml version="1.0" encoding="utf-8" standalone="yes" ?>
<feed xml:base="http://www.odatacustomers.com/ "
xmlns:d="http://odata.org"
xmlns:m="http://odata.org/metadata"
xmlns="http://www.w3.org/2005/Atom">
<title type="text">Customers</title>
<id>http://www.odatacustomers.com/Customers</id>
<updated>2011-02-16T01:00:25Z</updated>
<link rel="self" title="Customers" href="Customers" />
```

TABLE II-continued

```
<entry>
  <id>http://www.odatacustomers.com/Customers('BOTTM')</id>
  <title type="text" />
  <updated>2011-02-16T01:00:25Z</updated>
  <author>
  <name />
  </author>
  <link rel="edit" title="Customer" href="Customers('BOTTM')" />
  <category term="NorthwindModel.Customer"
  scheme="http://odata.org/scheme"
/>
  <content type="application/xml">
  <m:properties>
     <d:CustomerID>BOTTM</d:CustomerID>
     <d:CompanyName>Bottom-Dollar Markets</d:CompanyName>
     <d:ContactName>Elizabeth Lincoln</d:ContactName>
  </m:properties>
  </content>
</entry>
<deleted-entry ref="http://
www.odatacustomers.com/Customers('Cust10')"
when="2011-02-16T01:00:25Z"
xmlns=http://purl.org/atompub/tombstones/1.0
m:reason="deleted" /> <link rel="http://odata.org/delta"
href="www.odatacustomers.com/Customers?$deltatoken=8015" />
</feed>
```

In another example, Table III below describes JSON format for enumerating the last page of results that is associated with the initial query:

TABLE III

```
{
  "d":
  {
    "results":
    [
      {
        "_metadata":
        {
          "id":"http:// www.odatacustomers.com/Customers('BOTTM')",
          "uri":http://www.odatacustomers.com/Customers('BOTTM')",
          "type":"NorthwindModel.Customer"
        },
        "CustomerID":"BOTTM",
        "CompanyName":"Bottom-Dollar Markets",
        "ContactName":"Elizabeth Lincoln"
      },
      {
        "_deleted":
        {
          "id":"http:// www.odatacustomers.com/Customers('Cus10')",
          "when":"VDate(1297187419617)V"
          "reason": "deleted"
        }
      },
    ],
    "_delta":"http://
    www.odatacustomers.com/Customers?$deitatoken=8015"
  }
}
```

In one aspect, page of results 620 can include, along with changes, a next link or a delta link in response to OData component 210 determining that changes in data set 220 have occurred since OData component 210 received the initial request. As such, client 101 can obtain changes to data set 140 without downloading, copying, etc. data set 140, in its entirety to client 101. For example, page of results 620 can include a first page of changes and a next link in response to OData component 210 determining additional pages of changes to be returned to client 101, otherwise, page of results 620 can include a delta link in response to OData component 210 determining all known, detected, etc. changes were returned to client 101. In one embodiment, Table IV below describes Atom format for describing a delta link, e.g., exposed as a new feed level, or <link>, element:

TABLE IV

```
<link rel=" http://odata.org/delta " href=<url_to_retrieve_deltas> />
```

Figure 7:
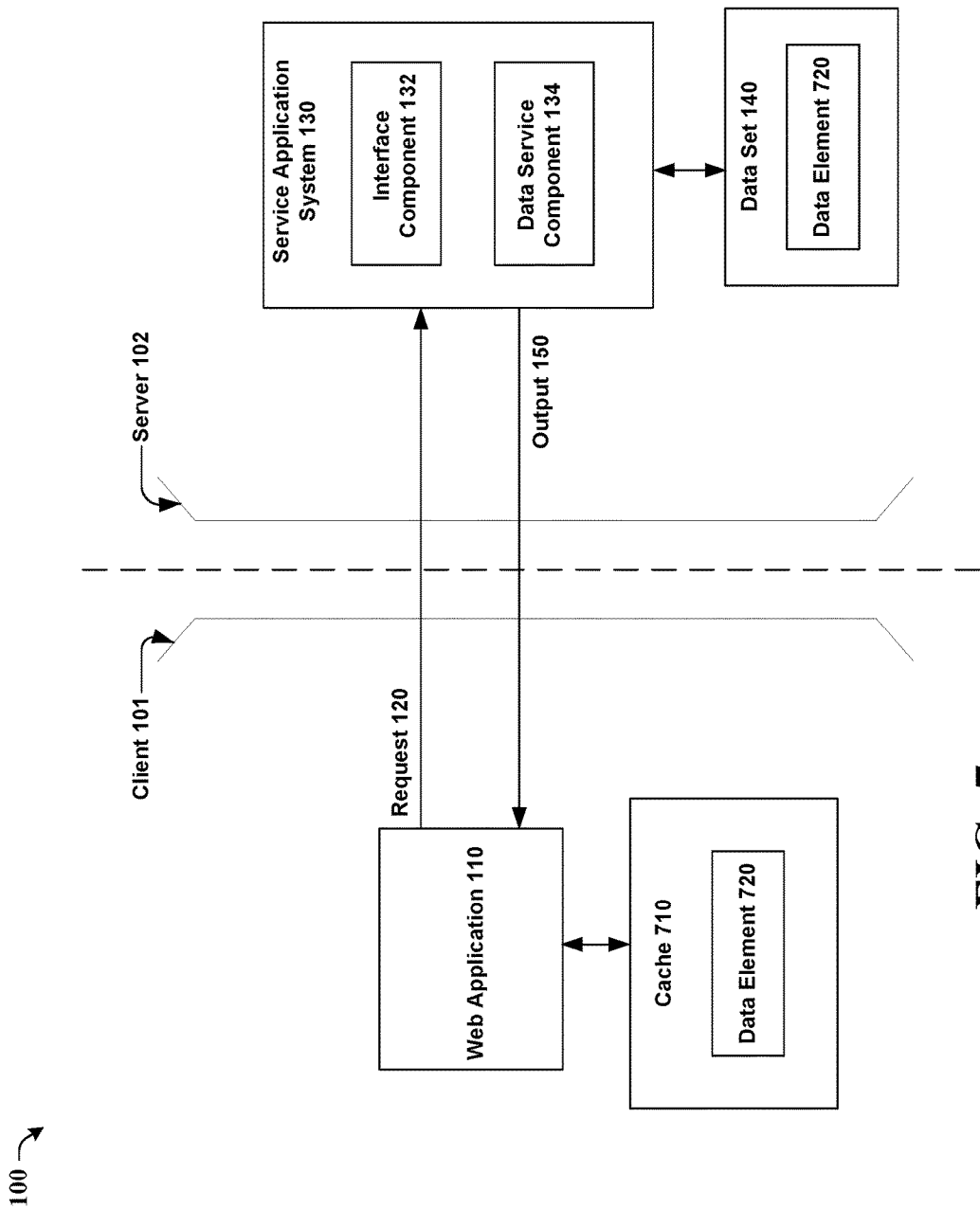
FIG. 7 illustrates an exemplary data services environment including a cache according to an embodiment.

Now referring to FIG. 7, client 101 can include cache 710 for storing data utilized by application(s) that, e.g., can be communicatively coupled to a data service, e.g., associated with service application system 130. For example, client 101 can receive, via output 150, first information, e.g., data elements, OData feeds, etc. that is associated with data element 720 of data set 140, in response to sending, via request 120, a first request that is associated with data set 140 to service application 130.

In an aspect, client 101 can populate cache 710 with the first information, e.g., received via one or more pages of results, e.g., including movies available for download, rental, etc. via an OData service, e.g., associated with OData component 210. In another aspect, client 101 can populate cache 710 based on information loaded, via client 101, from a storage medium, disk drive, tape media, memory device, etc.

Then, in response to receiving a link, e.g., a delta link, a URL, etc. including a token, e.g., a delta token, etc. for referencing a change of data set 140 from the OData service, client 101 can send, via web application 110, a second request, or delta query, utilizing the link, the delta link, the URL, etc. to the data service. Further, client 101 can receive second information that is associated with the change of data set 140, e.g., a change of data element 720, from the data service based on the second request. As such, client 101 can update one or more portions of cache 710 based on the change of data element 720—without retrieving the full data set 140 or repopulating cache 710 in entirety, e.g., in order to account for changes associated with data set 140, data element 720, etc.

In an aspect, the first request can include operator(s) for at least one of defining a result that is associated with the second information or formatting the result. For example, the URL can include an OData system query option, e.g., $filter operator, $select operator, $expand operator, etc. that can specify an amount of data that the OData service can return. As such, in an aspect, the $filter operator included in the query, or the URL, can indicate that client 101 requests output 150 be limited to include only changes of data set 140 related to a particular characteristic, e.g., data element 720. In another aspect, the $select operator included in the query, or the URL, can indicate that client 101 requests output 150 be limited to return a subset of properties, elements, etc. associated with changes of data set 140. In yet another aspect, the $expand operator included in the query, or the URL, can indicate that client 101 requests output 150 identify related entries, or data element(s), of data set 140 associated with the first request.

In one aspect, a non-result defining operator, e.g., $top, $skip, $inlinecount, $count, etc. included in the URL can indicate that client 101 requests output 150 be formatted in a particular way, e.g., display output 150 as a row/column matrix; page through results associated with the query; include a count of changes returned via the delta query; include a count of changes that have occurred since an initial request, etc.

In another aspect, server 102 can push change notifications to client 101, e.g., notify client 101 of changes made to data set 140. Then, in response to receiving such notifications, client 101 can poll server 102, e.g., via the second request, the delta query, etc. to identify data element(s), etc. of data set 140 that have changed since the first request. In another aspect, the change notification can include a URL, a delta link, a notification link, etc. that client 101 can reference, call, etc. to obtain, identify, etc. change(s) of data element(s), etc. of data set 140 that have occurred since the first request.

For example, client 101 can request that server 102 notify client 101 of changes made to data set 140, and server 102 can subsequently notify client 101 of such changes, e.g., via a change notification. In an aspect, client 101 can use the URL, the delta link, etc. to request such changes, e.g., upon server 102 sending the URL, the delta link, etc. in the change notification. As such, server 102 can send the change notification to client 101 regardless of whether such changes are associated with client 101, regardless of whether such changes are relevant to data initially retrieved by client 101, etc. In one aspect, client 101 can utilize cache 710 to store and/or retrieve the URL.

Figure 8:
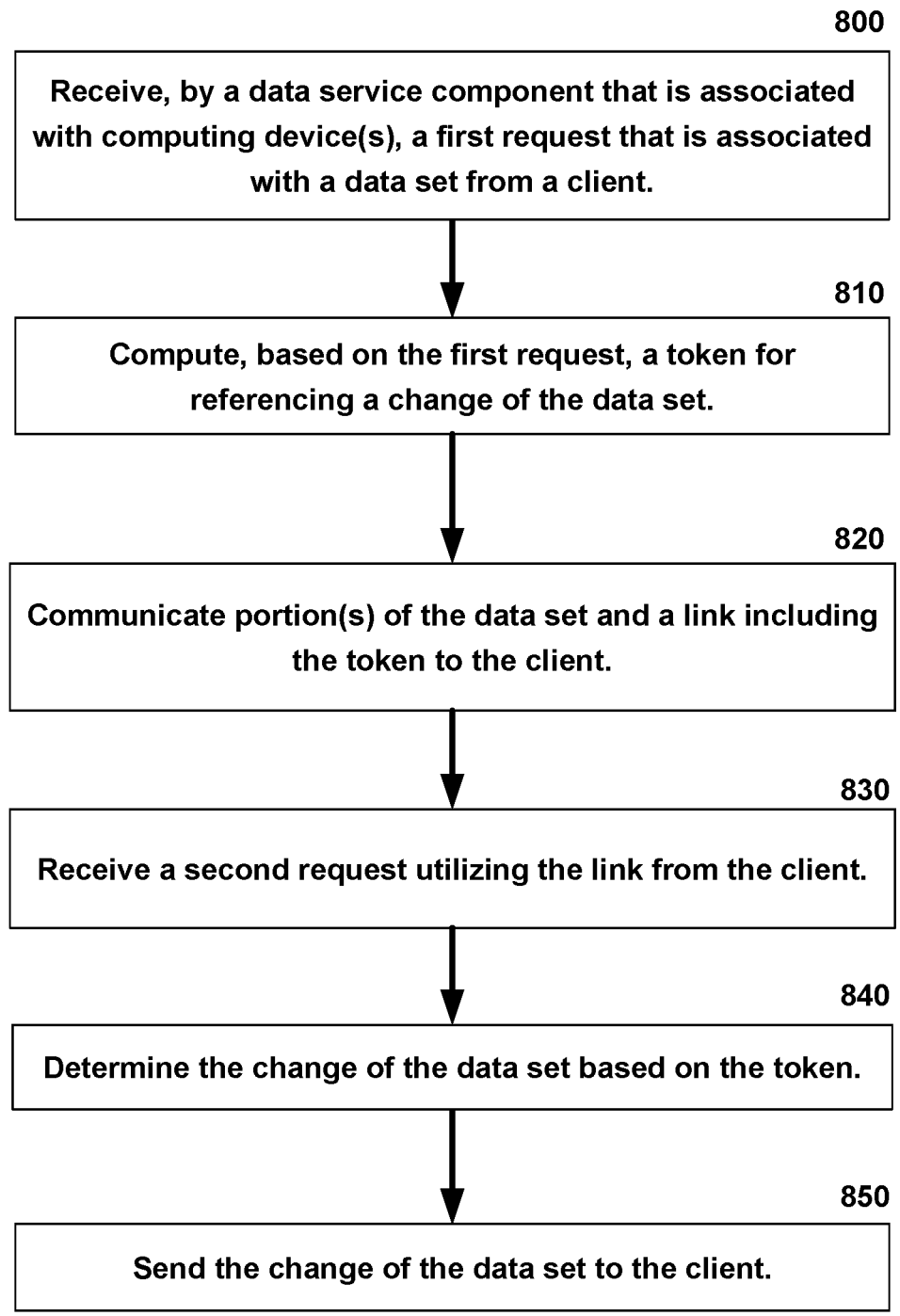
FIGS. 8-11 illustrate exemplary processes according to various embodiments.

FIG. 8 is a flow diagram illustrating an exemplary non-limiting embodiment for referencing a change in data utilizing a network resource locator. At 800, a first request that is associated with a data set can be received, by a data service component that is associated with computing device(s), from a client. At 810, a token, a change identifier, etc. can be computed, based on the first request, for referencing a change, a last change, a most recent detected change, etc. of the data set. At 820, portion(s) of the data set and a link including the token can be communicated to the client. At 830, a second request utilizing the link can be received from the client. At 840, the change of the data set can be determined based on the token. At 850, the change of the data set can be sent to the client.

In one embodiment, the token can be computed prior to communicating a first portion of the portion(s) to the client. In another embodiment, the token can be computed based on a determination of a change identifier, e.g., a time, a timestamp, a date, etc. that is associated with the change, the last change, the most recent detected change, etc.

In yet another embodiment, a first portion of the portion(s) and a first URL including the token can be sent to the client. Then, in response to a second request that is associated with the data set being received from the client, a second URL including the token can be sent to the client. In an embodiment, a second portion of the portion(s) can be sent to the client based on the second request.

In one embodiment, the portion(s) can be ordered based on an order, e.g., a chronological order, in which respective changes in the data set occurred, e.g., by sending pages of results indicating the respective changes in chronological order, for example, in response to receiving tokens in subsequent request(s) from the client associated with respective last enumerated changes.

In another embodiment, the first request can include operator(s) for defining a result that is associated with the portion(s) of the data set and/or for formatting the result. In yet another embodiment, the operator(s) can be sent to the client based on the second query.

Figure 9:
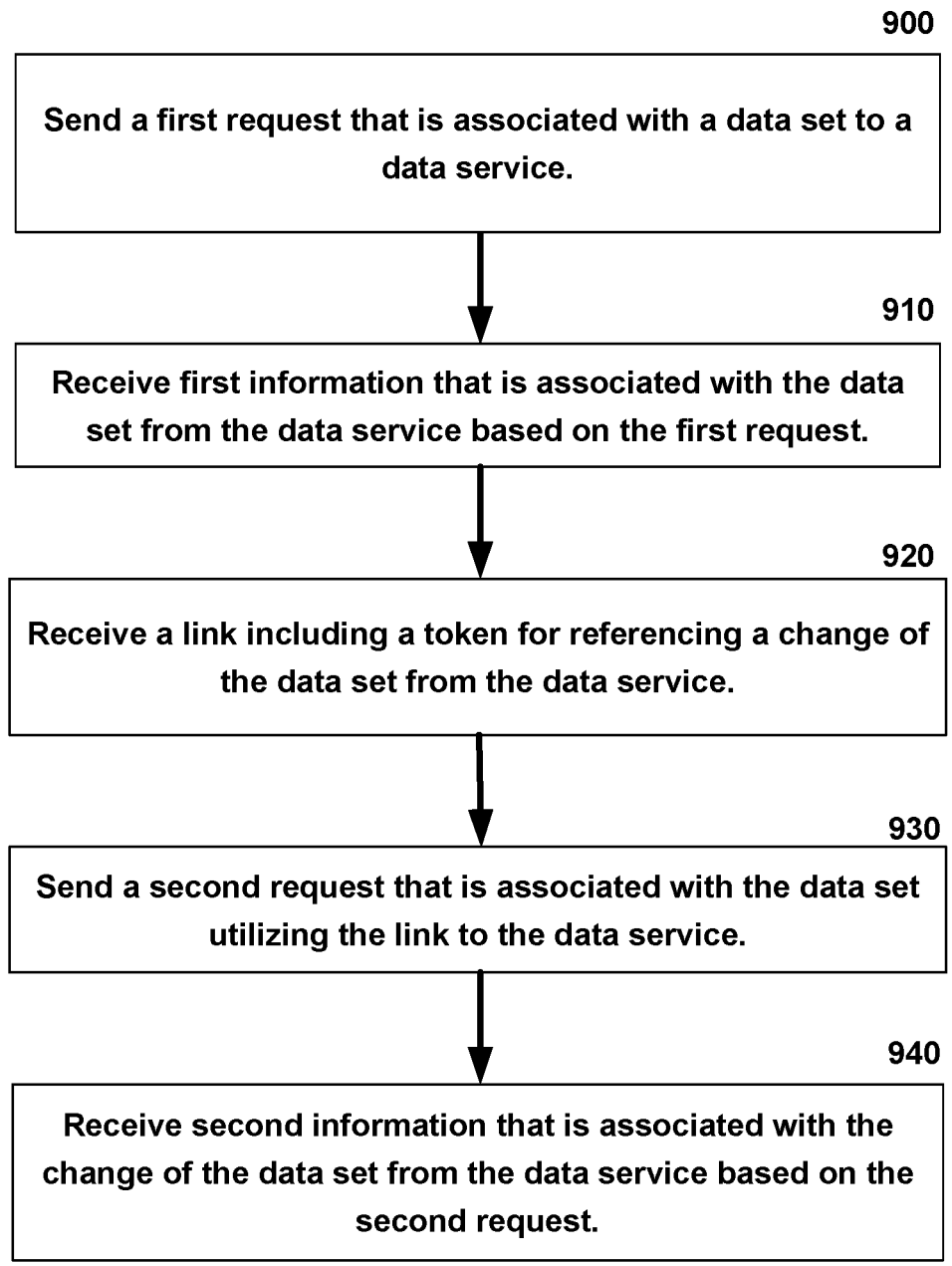

FIG. 9 is a flow diagram illustrating another exemplary non-limiting embodiment for referencing a change in data utilizing a network resource locator. At 900, a first request that is associated with a data set can be sent, e.g., by client 101, to a data service, e.g., an OData service. At 910, client 101 can receive, based on the first request, first information that is associated with the data set from the data service. At 920, client 101 can receive, from the data service, a link, e.g., a URL, including the token for referencing a change of the data set. At 930, client 101 can send, to the data service, a second request that is associated with the data set utilizing the link. At 940, client 101 can receive, from the data service, second information that is associated with the change of the data set based on the second request.

Figure 10:
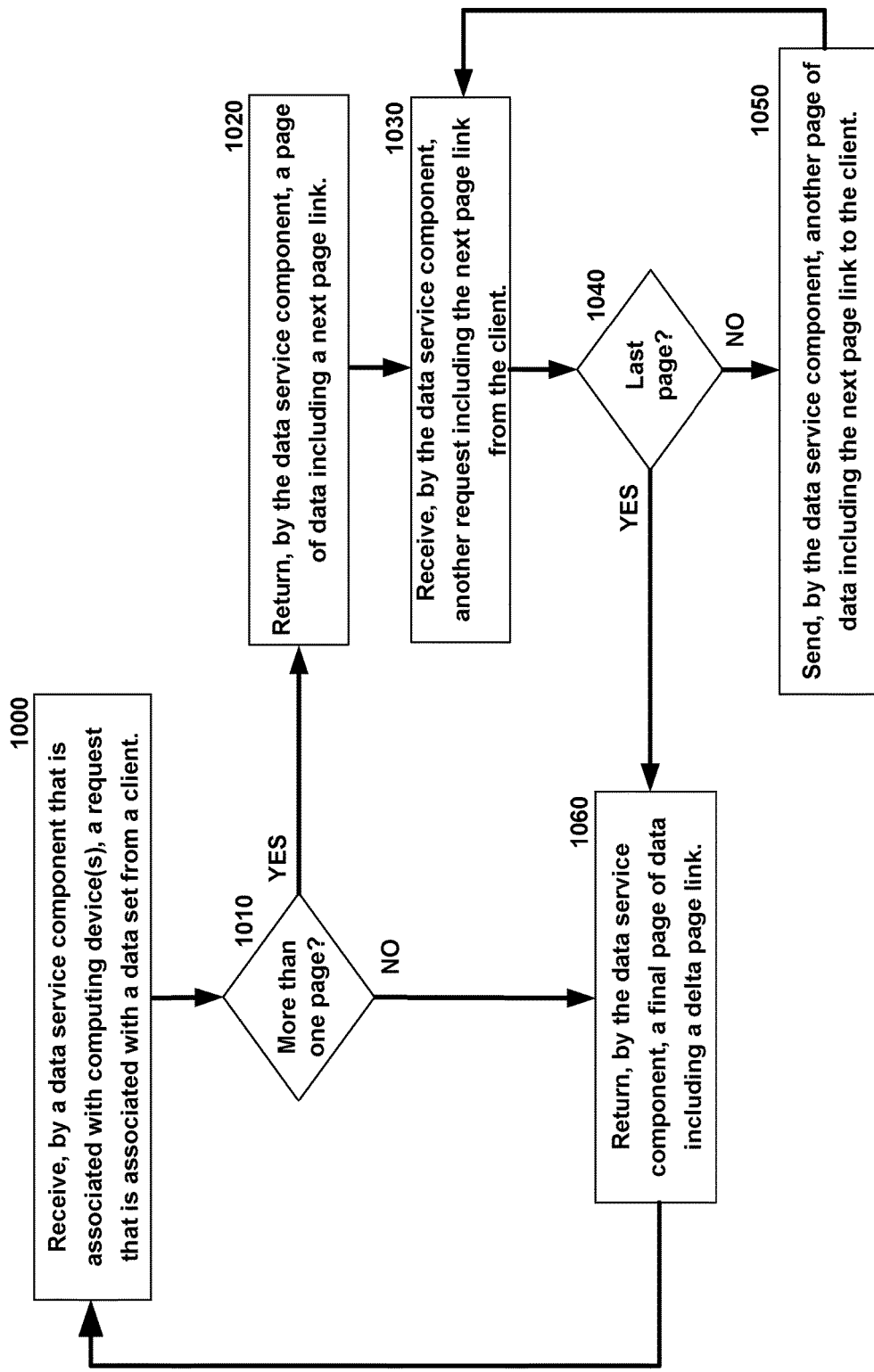

FIG. 10 is a flow diagram illustrating yet another exemplary non-limiting embodiment for referencing a change in data utilizing a network resource locator. At 1000, a request that is associated with a data set, e.g., data set 140, data set 220, etc. can be received by a data service component, e.g., data service component 134, from a client, e.g., client 101. At 1010, if more than one page of results is associated with the query, flow continues to 1020, at which a page, e.g., a first page of data, a first page of deltas, etc. can be returned, by the data service component, including a next page link; otherwise, flow continues to 1060, at which a final page of data including a delta page link can be returned by the data service component, and flow continues from 1060 to 1000.

Flow continues from 1020 to 1030, at which the data service component can receive another request including the next page link from the client. At 1040, if the next page link is associated with a last page of results, then flow continues to 1060, at which the final page of data including the delta page link can be returned by the data service component; otherwise, flow continues to 1050, at which another page of data including the next page link can be sent, by the data service component, to the client.

Figure 11:
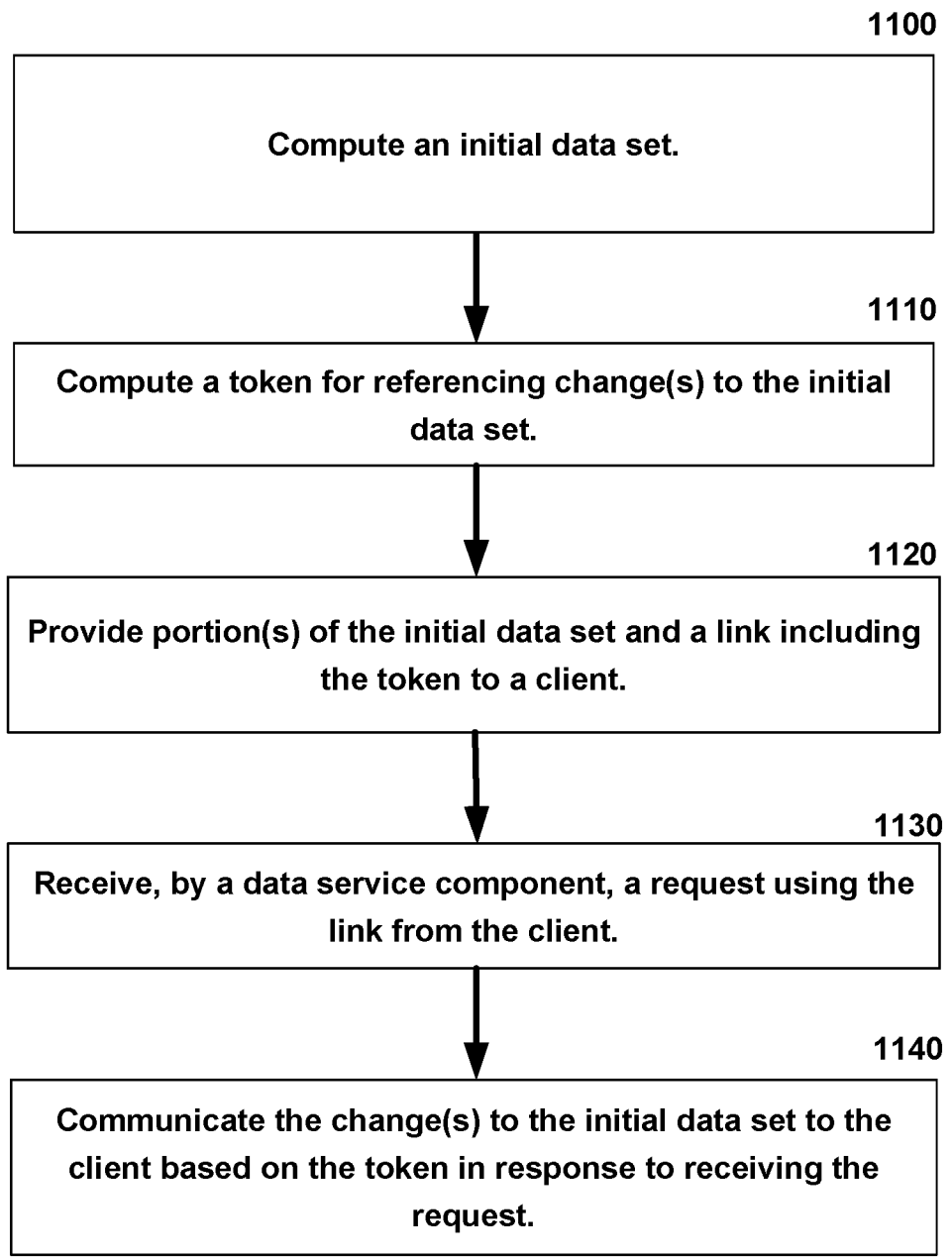

FIG. 11 is a flow diagram illustrating an exemplary non-limiting embodiment for referencing a change in data utilizing a network resource locator via, e.g., a bootstrapping mechanism. At 1100, an initial data set can be computed. At 1110, a token for referencing change(s) to the initial data set can be computed. At 1120, portion(s) of the initial data set and a link including the token can be provided via, e.g., a data transfer, a bulk data transfer, a physical media, a recording medium, an application, etc. to a client, e.g., client 101. At 1130, a request using the link can be received, for example, by data service component 134, from the client. At 1140, the change(s) of the data set can be sent, communicated, returned, etc. to the client based on the token in response to receiving the request.

For example, an initial data set and the link can be provided, or included, in a mobile device, e.g., a global positioning system, a wireless communication device, etc. Further, the mobile device can utilize the link to get subsequent changes to the initial data set. In one aspect, in response to the unit obtaining the subsequent changes, the unit can also receive, e.g., via functionality associated with service application system 130 and/or methods associated with FIGS. 8-10 described above, a new token for retrieving further changes.

Exemplary Networked and Distributed Environments

One of ordinary skill in the art can appreciate that the various embodiments for referencing a change in data utilizing a network resource locator described herein can be implemented in connection with any computer or other client device, e.g., client 101, server 102, etc. Such device can be deployed as part of a computer network or in a distributed computing environment, and can be connected to any kind of data store where media may be found. In this regard, the various embodiments described herein can be implemented in any computer system or environment having any number of memory or storage units, and any number of applications and processes occurring across any number of storage units. This includes, but is not limited to, an environment with server computers and client computers deployed in a network environment or a distributed computing environment, having remote or local storage.

Distributed computing provides sharing of computer resources and services by communicative exchange among computing devices and systems. These resources and services include the exchange of information, cache storage and disk storage for objects, such as files. These resources and services also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may participate in mechanisms for performing operations associated with for referencing a change in data utilizing a network resource locator described for various embodiments of the subject disclosure.

Figure 12:
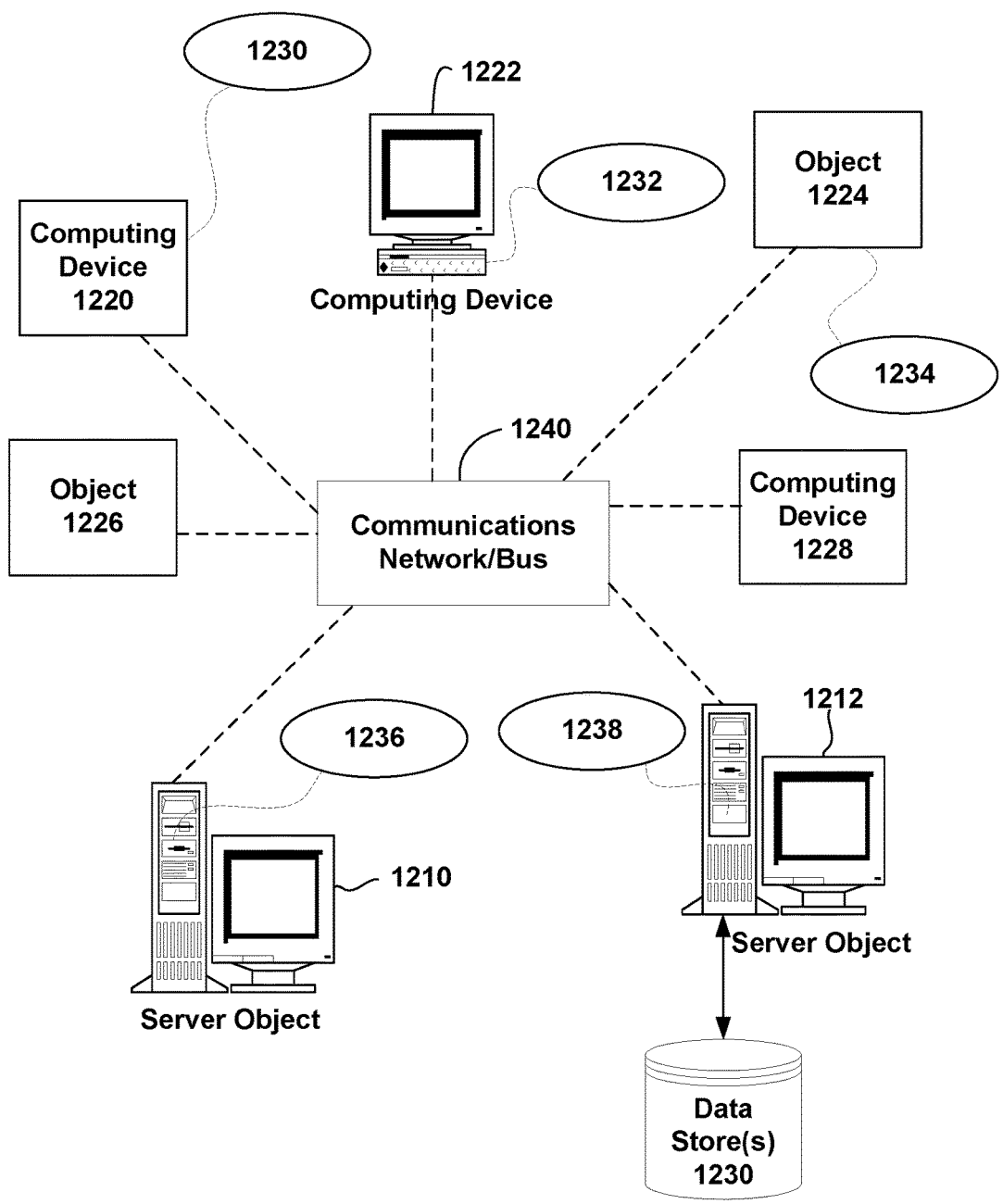
FIG. 12 is a block diagram representing exemplary non-limiting networked environments in which various embodiments described herein can be implemented.

FIG. 12 provides a schematic diagram of an exemplary networked or distributed computing environment. The distributed computing environment comprises computing objects 1210, 1212, etc. and computing objects or devices 1120, 1222, 1224, 1226, 1228, etc., which may include programs, methods, data stores, programmable logic, etc., as represented by applications 1230, 1232, 1234, 1236, 1238. It can be noted that computing objects 1210, 1212, etc. and computing objects or devices 1120, 1222, 1224, 1226, 1228, etc. may comprise different devices, such as PDAs, audio/video devices, mobile phones, MP3 players, personal computers, laptops, etc.

Each computing object 1210, 1212, etc. and computing objects or devices 1220, 1222, 1224, 1226, 1228, etc. can communicate with one or more other computing objects 1210, 1212, etc. and computing objects or devices 1220, 1222, 1224, 1226, 1228, etc. by way of the communications network 1240, either directly or indirectly. Even though illustrated as a single element in FIG. 12, network 1240 may comprise other computing objects and computing devices that provide services to the system of FIG. 12, and/or may represent multiple interconnected networks, which are not shown. Each computing object 1210, 1212, etc. or computing objects or devices 1220, 1222, 1224, 1226, 1228, etc. can also contain an application, such as applications 1230, 1232, 1234, 1236, 1238, that might make use of an API, or other object, software, firmware and/or hardware, suitable for communication with or implementation of the techniques for referencing a change in data utilizing a network resource locator provided in accordance with various embodiments of the subject disclosure.

There are varieties of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems for referencing a change in data utilizing a network resource locator as described in various embodiments.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service without having to "know" any working details about the other program or the service itself.

In a client/server architecture, particularly a networked system, a client, e.g., client 101, is usually a computer, that accesses shared network resources provided by another computer, e.g., server 102. In the illustration of FIG. 12, as a non-limiting example, computing objects or devices 1220, 1222, 1224, 1226, 1228, etc. can be thought of as clients and computing objects 1210, 1212, etc. can be thought of as servers in which computing objects 1210, 1212, etc. provide data services, such as receiving data from client computing objects or devices 1220, 1222, 1224, 1226, 1228, etc., storing of data, processing of data, transmitting data to client computing objects or devices 1220, 1222, 1224, 1226, 1228, etc., although any computer can be considered a client, a server, or both, depending on the circumstances. Any of these computing devices may be processing data, or requesting transaction services or tasks that may implicate the techniques for referencing a change in data utilizing a network resource locator as described herein for one or more embodiments.

A server, e.g., server 101, is typically a remote computer system accessible over a remote or local network, such as the Internet or wireless network infrastructures. The client process may be active in a first computer system, and the server process may be active in a second computer system, e.g., related to embodiments associated with FIGS. 1-11 disclosed herein, communicating with one another over a communications medium, thus providing distributed functionality and allowing multiple clients to take advantage of the information-gathering capabilities of the server. Any software objects utilized pursuant to the techniques for referencing a change in data utilizing a network resource locator can be provided standalone, or distributed across multiple computing devices or objects.

In a network environment in which the communications network/bus 1240 is the Internet, for example, e.g., related to embodiments associated with FIGS. 1-11 disclosed herein, the computing objects 1210, 1212, etc. can be Web servers with which the client computing objects or devices 1220, 1222, 1224, 1226, 1228, etc. communicate via any of a number of known protocols, such as HTTP. Servers 1210, 1212, etc. may also serve as client computing objects or devices 1220, 1222, 1224, 1226, 1228, etc., as may be characteristic of a distributed computing environment.

Exemplary Computing Device

Figure 13:
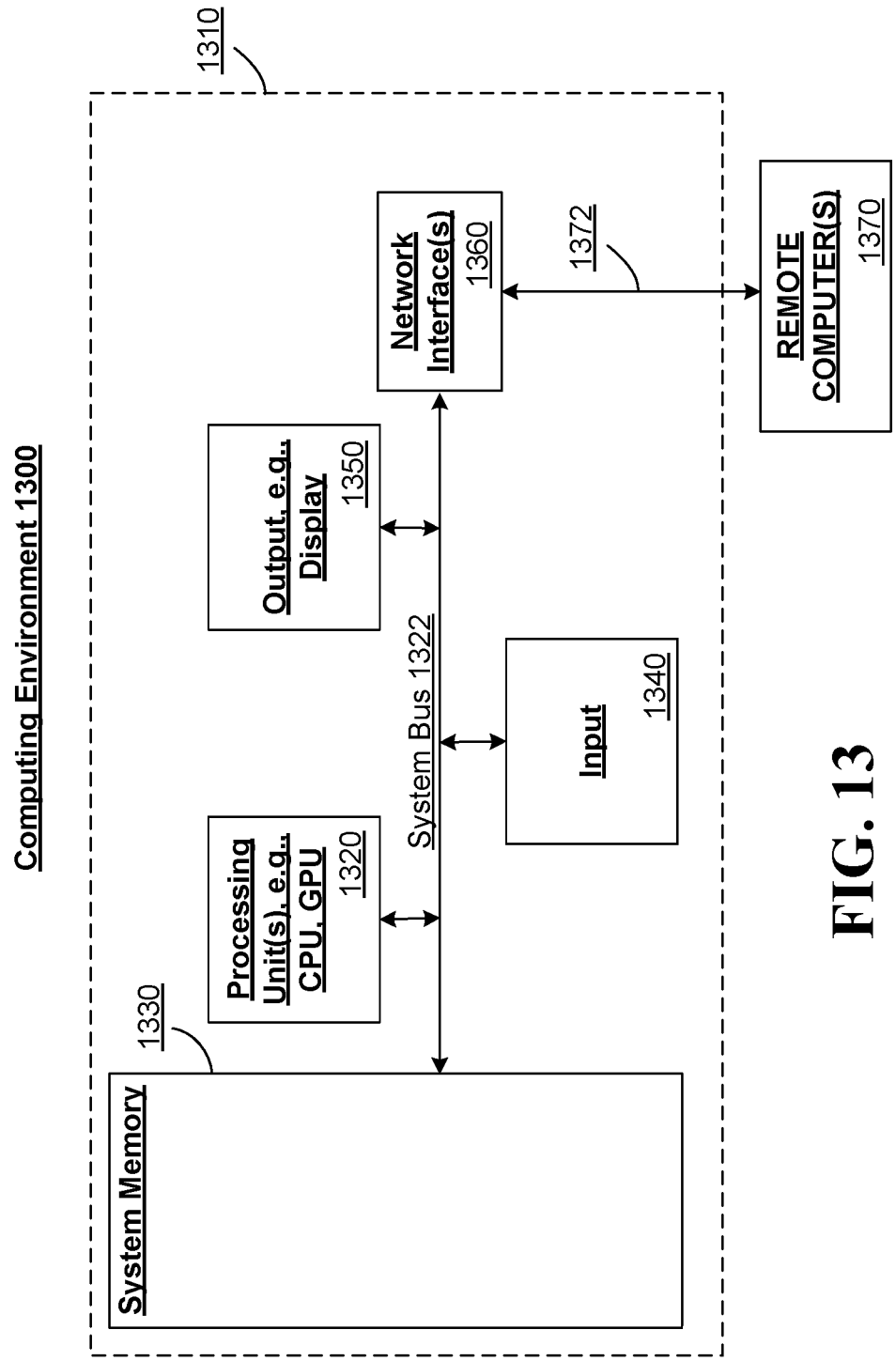
FIG. 13 is a block diagram representing an exemplary non-limiting computing system or operating environment in which one or more aspects of various embodiments described herein can be implemented.

As mentioned, advantageously, the techniques described herein can be applied to any device where it is desirable to reference a change in data utilizing a network resource locator. It is to be understood, therefore, that handheld, portable and other computing devices and computing objects of all kinds are contemplated for use in connection with the various embodiments, i.e., anywhere that a device may wish to access information via a REST-based data service enabling a server to perform operations associated with referencing a change in data utilizing a network resource locator. Accordingly, the below general purpose computer described below in FIG. 13 is but one example of a computing device. Additionally, a server, or a database server, e.g., associated with the service application described above, can include one or more aspects of the below general purpose computer.

Although not required, embodiments can partly be implemented via an operating system, for use by a developer of services for a device or object, and/or included within application software, e.g., associated with service application system 130, which operates to perform one or more functional aspects of the various embodiments described herein. Software may be described in the general context of computer executable instructions, such as program modules, being executed by one or more computers, such as client workstations, servers or other devices. Those skilled in the art will appreciate that computer systems have a variety of configurations and protocols that can be used to communicate data, and thus, no particular configuration or protocol is to be considered limiting.

FIG. 13 thus illustrates an example of a suitable computing system environment 1300 in which one or aspects of the embodiments described herein can be implemented, although as made clear above, the computing system environment 1300 is only one example of a suitable computing environment and is not intended to suggest any limitation as to scope of use or functionality. Neither is the computing environment 1300 interpreted as having any dependency or requirement relating to any one or combination of components illustrated in the exemplary operating environment 1300.

With reference to FIG. 13, an exemplary remote device for implementing one or more embodiments includes a general purpose computer, or computing device, in the form of computer 1310. Components of computer 1310 may include, but are not limited to, a processing unit 1320, a system memory 1330, and a system bus 1322 that couples various system components including the system memory to the processing unit 1320.

Computer 1310 typically includes a variety of computer readable media and can be any available media that can be accessed by computer 1310. The system memory 1330 may include computer storage media in the form of volatile and/or nonvolatile memory such as read only memory (ROM) and/or random access memory (RAM). By way of example, and not limitation, memory 1330 may also include an operating system, application programs, other program modules, and program data.

A user can enter commands and information into computer 1310 through input devices 1340. A monitor or other type of display device is also connected to the system bus 1322 via an interface, such as output interface 1350. In addition to a monitor, computers can also include other peripheral output devices such as speakers and a printer, which may be connected through output interface 1350.

Computer 1310 may operate in a networked or distributed environment using logical connections and network interfaces 1360 to one or more other remote computers, such as remote computer 1370. The remote computer 1370 may be a personal computer, a server, a router, a network PC, a peer device or other common network node, or any other remote media consumption or transmission device, and may include any or all of the elements described above relative to computer 1310. The logical connections depicted in FIG. 13 include a network 1372, such local area network (LAN) or a wide area network (WAN), but may also include other networks/buses. Such networking environments are commonplace in homes, offices, enterprise-wide computer networks, intranets and the Internet.

As mentioned above, while exemplary embodiments have been described in connection with various computing devices and network architectures, the underlying concepts may be applied to any network system and any computing device or system in which it is desirable to publish or consume media in a flexible way.

Also, there are multiple ways to implement the same or similar functionality, e.g., an appropriate API, tool kit, driver code, operating system, control, standalone or downloadable software object, etc. which enables applications and services to take advantage of the techniques for referencing a change in data utilizing a network resource locator described herein. Thus, embodiments herein are contemplated from the standpoint of an API (or other software object), as well as from a software or hardware object that implements one or more aspects of such techniques. Thus, various embodiments described herein can have aspects that are wholly in hardware, partly in hardware and partly in software, as well as in software.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

As mentioned, the various techniques described herein may be implemented in connection with hardware or software or, where appropriate, with a combination of both. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

The aforementioned systems have been described with respect to interaction between several components. It can be noted that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it is to be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that can be implemented in accordance with the described subject matter will be better noted with reference to the flowcharts of the various figures. While for purposes of simplicity of explanation, the methodologies are shown and described as a series of blocks, it is to be understood and noted that the claimed subject matter is not limited by the order of the blocks, as some blocks may occur in different orders and/or concurrently with other blocks from what is depicted and described herein. Where non-sequential, or branched, flow is illustrated via flowchart, it can be noted that various other branches, flow paths, and orders of the blocks, may be implemented which achieve the same or a similar result. Moreover, not all illustrated blocks may be required to implement the methodologies described hereinafter.

In addition to the various embodiments described herein, it is to be understood that other similar embodiments can be used or modifications and additions can be made to the described embodiment(s) for performing the same or equivalent function of the corresponding embodiment(s) without deviating there from. Still further, multiple processing chips or multiple devices can share the performance of one or more functions described herein, and similarly, storage can be affected across a plurality of devices. Accordingly, the embodiments are not to be limited to any single embodiment, but rather can be construed in breadth, spirit and scope in accordance with the appended claims.

What is claimed is:

1. A computer-implemented method for managing a data services environment that comprises a service application system from which a data set is accessed by a client computing system, and wherein the client computing system is able to update one or more portions of a cache based on changes made to the data set at the service application system, but without having to retrieve the full data set or having to repopulate the client cache in its entirety in order to account for the changes made to the data set, the computer-implemented method being implemented by one or more processors when executing computer-executable instructions for the method, which comprises:
   accessing a data set in a data store of the service application system;
   computing at the service application system a token for referencing one or more changes to the data set;
   providing from the service application system one or more portions of the data set and the computed token to the client computing system;
   receiving at the service application system a request from the client computing system to change the data set, wherein the request includes the computed token;
   in response to the request and the computed token, identifying one or more changes to the data set; and
   communicating from the service application system the one or more changes to the data set to the client computing system.

2. The computer-implemented method of claim 1, wherein the token is computed by determining the token prior to determining the one or more portions that are provided to the client computing system.

3. The computer-implemented method of claim 1, wherein the token is computed by determining a change identifier that is associated with a most recent detected change of the data set.

4. The computer-implemented method of claim 1, wherein the token is computed by determining a timestamp enumerating a time that is associated with the one or more changes.

5. The computer-implemented method of claim 1, wherein the token is computed by determining a date of the one or more changes.

6. The computer-implemented method of claim 1, wherein the one or more portions of the data set are provided to the client computing system in a first portion of the data set with the token and wherein the token is referenced in a first uniform resource locator (URL).

7. The computer-implemented method of claim 1, wherein the one or more portions of the data set are provided to the client computing system in at least two different portions of the data set, and wherein each of the different portions are provided in response to receiving different requests that are associated with each of the different portions, respectively, and wherein each request is sent with a URL that references the computed token.

8. The computer-implemented method of claim 7, wherein at least one change to the data set is determined for each different portion based on the respective request that includes the computed token.

9. The computer-implemented method of claim 8, wherein each change to the data set is sent to the client computing system.

10. The computer-implemented method of claim 9, wherein each change to the data set is ordered based on a chronological order in which the respective changes in the data set were determined.

11. The computer-implemented method of claim 1, wherein:
   a new request is received from the client computing system, the new request being associated with the data set and including a first URL that includes the token; and
   a new token identified by a second URL is sent to the client computing system.

12. The computer-implemented method of claim 1, wherein the request includes at least one operator for defining a result that is associated with the one or more portions of the data set.

13. A computer-implemented method for managing a data services environment that comprises a service application system from which a data set is accessed by a client computing system, and wherein the client computing system is able to update one or more portions of a cache based on changes made to the data set at the service application system, but without having to retrieve the full data set or having to repopulate the client cache in its entirety in order to account for the changes made to the data set, the computer-implemented method being implemented by one or more processors when executing computer-executable instructions for the method, which comprises:
   receiving at the service application system a request from the client computing system to change a portion of the data set stored in the data store, wherein the request includes at least one operator for defining a result associated with the portion of the data set;
   computing at the service application system a token that is used to reference the requested change to the portion of the data set; and
   sending from the service application system to the client computing system a link that includes the computed token and operator associated with the requested change to the portion of the data set.

14. The computer-implemented method of claim 13, wherein the change to the data set is based on the operator.

15. The computer-implemented method of claim 13, wherein the link sent to the client computing system comprises a uniform resource locator.

16. A computer-implemented method for managing a data services environment that comprises a service application system from which a data set is accessed by a client computing system, and wherein the client computing system is able to update one or more portions of a cache based on changes made to the data set at the service application system, but without having to retrieve the full data set or having to repopulate the client cache in its entirety in order to account for the changes made to the data set, the computer-implemented method being implemented by one or more processors when executing computer-executable instructions for the method, which comprises:
   receiving, at the service application system, a first request from the client computing system that is associated with a data set stored at a data store of the service application system;
   in response to the receiving the first request, the service application computing a token for referencing a change to a portion of the data set, wherein the token is determined prior to determining the portion of the data set to be changed; and
   communicating, from the service application system, the portion of the data set and a link including the token to the client computing system.

17. The computer-implemented method of claim 16, wherein computing the token comprises determining a timestamp enumerating a time that is associated with the change.

18. The computer-implemented method of claim 16, wherein computing the token comprises determining a date of the change.

19. The computer-implemented method of claim 16, wherein communicating the portion of the data set and the link comprises sending a first uniform resource locator (URL) including the token to the client computing system, and wherein the computer-implemented method further comprises:
   receiving a second request that is associated with the data set including the first URL from the client computing system; and
   sending a second URL including another token to the client computing system.

20. The computer-implemented method of claim 16, wherein communicating the portion of the data set and the link comprises:
   sending a first portion of the data set and a first uniform resource locator (URL) including the computed token and to the client computing system; and
   in response to receiving a second request that is associated with the data set from the client computing system, sending a second URL including the computed token to the client computing system.

21. A computer system for managing a data services environment that comprises:
   a service application system from which a data set is accessed by a client computing system;
   a data store maintained at the service application system and which contains the data set;
   one or more processors;
   a computer-readable storage device storing computer-executable instructions which, when executed by the one or more processors, configure the computer system with an architecture that enables the client computing system to update one or more portions of a cache based on changes made to the data set at the service application system, but without having to retrieve the full data set or having to repopulate the client cache in its entirety in order to account for the changes made to the data set, and wherein the architecture performs at least the following:
   accesses a data set in a data store of the service application system;
   computes at the service application system a token for referencing one or more changes to the data set;
   provides from the service application system one or more portions of the data set and the computed token to the client computing system;
   receives at the service application system a request from the client computing system to change the data set, wherein the request includes the computed token;
   in response to the request and the computed token, identifies one or more changes to the data set; and
   communicates from the service application system the one or more changes to the data set to the client computing system.

22. The computer system of claim 21, wherein the token is computed by determining the token prior to determining the one or more portions that are provided to the client computing system.

23. The computer system of claim 21, wherein the token is computed by determining a change identifier that is associated with a most recent detected change of the data set.

24. The computer system of claim 21, wherein the token is computed by determining a timestamp enumerating a time that is associated with the one or more changes.

25. The computer system of claim 21, wherein the token is computed by determining a date of the one or more changes.

26. The computer system of claim 21, wherein the one or more portions of the data set are provided to the client system in a first portion of the data set with the token and wherein the token is referenced in a first uniform resource locator (URL).

27. The computer system of claim 21, wherein the one or more portions of the data set are provided to the client computing system in at least two different portions of the data set, and wherein each of the different portions are provided in response to receiving different requests that are associated with each of the different portions, respectively, and wherein each request is sent with a URL that references the computed token.

28. The computer system of claim 27, wherein at least one change to the data set is determined for each different portion based on the respective request that includes the computed token.

29. The computer system of claim 28, wherein each change to the data set is sent to the client computing system.

30. The computer system of claim 29, wherein each change to the data set is ordered based on a chronological order in which the respective changes in the data set were determined.

31. The computer system of claim 21, wherein:
a new request is received from the client system, the new request being associated with the data set and including a first URL that includes the token; and
a new token identified by a second URL is sent to the client computing system.

32. The computer system of claim 21, wherein the request includes at least one operator for defining a result that is associated with the one or more portions of the data set.

33. A computer system for managing a data services environment that comprises:
a service application system from which a data set is accessed by a client computing system;
a data store maintained at the service application system and which contains the data set;
one or more processors;
a computer-readable storage device storing computer-executable instructions which, when executed by the one or more processors, configure the computer system with an architecture that enables the client computing system to update one or more portions of a cache based on changes made to the data set at the service application system, but without having to retrieve the full data set or having to repopulate the client cache in its entirety in order to account for the changes made to the data set, and wherein the architecture performs at least the following:
receives at the service application system a request from the client computing system to change a portion of the data set stored in the data store, wherein the request includes at least one operator for defining a result associated with the portion of the data set;
computes at the service application system a token that is used to reference the requested change to the portion of the data set; and
sends from the service application system to the client computing system a link that includes the computed token and operator associated with the requested change to the portion of the data set.

34. The computer system of claim 33, wherein the change to the data set is based on the operator.

35. The computer system of claim 33, wherein the link sent to the client computing system comprises a uniform resource locator.

36. A computer system for managing a data services environment that comprises:
a service application system from which a data set is accessed by a client computing system;
a data store maintained at the service application system and which contains the data set;
one or more processors;
a computer-readable storage device storing computer-executable instructions which, when executed by the one or more processors, configure the computer system with an architecture that enables the client computing system to update one or more portions of a cache based on changes made to the data set at the service application system, but without having to retrieve the full data set or having to repopulate the client cache in its entirety in order to account for the changes made to the data set, and wherein the architecture performs at least the following:
receives, at the service application system, a first request from the client computing system that is associated with a data set stored at a data store of the service application system;
in response to the receiving the first request, the service application computes a token for referencing a change to a portion of the data set, wherein the token is determined prior to determining the portion of the data set to be changed; and
communicates, from the service application system, the portion of the data set and a link including the token to the client computing system.

37. The computer system of claim 36, wherein computing the token comprises determining a timestamp enumerating a time that is associated with the change.

38. The computer system of claim 36, wherein computing the token comprises determining a date of the change.

39. The computer system of claim 36, wherein communicating the portion of the data set and the link comprises sending a first uniform resource locator (URL) including the token to the client computing system, and wherein the architecture of the computing system is further configured to perform:
receiving a second request that is associated with the data set including the first URL from the client computing system; and
sending a second URL including another token to the client computing system.

40. The computer system of claim 36, wherein communicating the portion of the data set and the link comprises:
sending a first portion of the data set and a first uniform resource locator (URL) including the computed token and to the client computing system; and
in response to receiving a second request that is associated with the data set from the client computing system, sending a second URL including the computed token to the client computing system.

* * * * *